United States Patent
Chan et al.

(10) Patent No.: US 9,257,534 B2
(45) Date of Patent: Feb. 9, 2016

(54) SINGLE POLY PLATE LOW ON RESISTANCE EXTENDED DRAIN METAL OXIDE SEMICONDUCTOR DEVICE

(71) Applicant: Macronix International Co., Ltd., Hsinchu (TW)

(72) Inventors: Wing-Chor Chan, Hsinchu (TW); Shyi-Yuan Wu, Hsinchu (TW)

(73) Assignee: MACRONIX INTERNATIONAL CO. LTD., Hsinchu (TW)

( * ) Notice: Subject to any disclaimer, the term of this patent is extended or adjusted under 35 U.S.C. 154(b) by 0 days.

(21) Appl. No.: 14/600,305

(22) Filed: Jan. 20, 2015

(65) Prior Publication Data

US 2015/0140764 A1  May 21, 2015

Related U.S. Application Data

(62) Division of application No. 14/010,066, filed on Aug. 26, 2013, now Pat. No. 8,969,962.

(60) Provisional application No. 61/820,184, filed on May 7, 2013.

(51) Int. Cl.
*H01L 29/76* (2006.01)
*H01L 29/94* (2006.01)
(Continued)

(52) U.S. Cl.
CPC ........ *H01L 29/66681* (2013.01); *H01L 21/225* (2013.01); *H01L 21/265* (2013.01); *H01L 21/26546* (2013.01); *H01L 21/31111* (2013.01); *H01L 29/0638* (2013.01); *H01L 29/0653* (2013.01); *H01L 29/0878* (2013.01); *H01L 29/1095* (2013.01); *H01L 29/66575* (2013.01); *H01L 29/66659* (2013.01); *H01L 29/7816* (2013.01)

(58) Field of Classification Search
CPC ............ H01L 29/7835; H01L 29/0847; H01L 29/66059; H01L 29/0696
USPC ........................................................ 257/343
See application file for complete search history.

(56) References Cited

U.S. PATENT DOCUMENTS

| | | | | |
|---|---|---|---|---|
| 2011/0089498 | A1* | 4/2011 | Sonsky et al. | 257/392 |
| 2012/0228704 | A1* | 9/2012 | Ju | 257/339 |

(Continued)

*Primary Examiner* — Phuc Dang
(74) *Attorney, Agent, or Firm* — Alston & Bird LLP

(57) ABSTRACT

A semiconductor device, in particular, an extended drain metal oxide semiconductor (ED-MOS) device, defined by a doped shallow drain implant in a drift region. For example, an extend drain n-channel metal oxide semiconductor (ED-NMOS) device is defined by an n doped shallow drain (NDD) implant in the drift region. The device is also characterized by conductive layer separated from a substrate in part by a thin oxide layer and in another part by a thick/thin oxide layer. A method of fabricating a semiconductor device, in particular an ED-NMOS device, having a doped shallow drain implant of a drift region is also provided. A method is also provided for fabricating conductive layer disposed in part across a thin oxide layer and in another part across a thick/thin oxide layer.

17 Claims, 17 Drawing Sheets

(51) Int. Cl.
*H01L 31/062* (2012.01)
*H01L 31/113* (2006.01)
*H01L 31/119* (2006.01)
*H01L 29/66* (2006.01)
*H01L 29/78* (2006.01)
*H01L 21/265* (2006.01)
*H01L 21/225* (2006.01)
*H01L 21/311* (2006.01)
*H01L 29/06* (2006.01)
*H01L 29/08* (2006.01)
*H01L 29/10* (2006.01)

(56) References Cited

U.S. PATENT DOCUMENTS

2013/0228873 A1* 9/2013 Tseng et al. .................. 257/369
2013/0320431 A1* 12/2013 Su et al. ........................ 257/329
2014/0061787 A1* 3/2014 Kim .............................. 257/339

* cited by examiner

SINGLE POLY PLATE LOW ON RESISTANCE EXTENDED DRAIN METAL OXIDE SEMICONDUCTOR DEVICE

CROSS-REFERENCE TO RELATED APPLICATIONS

This application is a divisional of U.S. application Ser. No. 14/010,066 filed Aug. 26, 2013, which claims priority to U.S. Provisional Application No. 61/820,184 filed May 7, 2013, the contents of each is fully incorporated herein by reference.

TECHNOLOGICAL FIELD

The present invention generally relates to a semiconductor device having reduced power-on resistance. In particular, the present invention relates to an extended drain metal oxide semiconductor (ED-MOS) transistor having a low ON resistance ($R_{ON}$). The present invention is also directed to a method for fabricating such semiconductor devices.

BACKGROUND

FIG. 1 illustrates a cross-sectional view of a conventional extended drain n-type metal oxide semiconductor (ED-NMOS) transistor.

The MOS transistor has three modes of operation depending upon the terminal voltages. For example, a MOS transistor has terminal voltages $V_g$ (gate terminal voltage), $V_s$ (source terminal voltage), and $V_d$ (drain terminal voltage). The NMOS operates in a cutoff mode when a bias voltage $V_{gs}$ between the gate and the source is less than the threshold voltage $V_{th}$ of the MOS transistor. Essentially, in the cutoff mode, no channel develops and the current $I_{ds}$ in the channel region is zero.

The NMOS operates in a linear mode when the bias voltage $V_{gs}$ exceeds the threshold voltage $V_{th}$ as long as a channel voltage $V_{ds}$ does not exceed a saturation voltage $V_{ds,sat}$. Typically, the saturation voltage is defined as the bias voltage $V_{gs}$ less the threshold voltage $V_{th}$. The current $I_{ds}$ increases with the channel voltage $V_{ds}$ when the NMOS is in the linear mode. Finally, the channel pinches off and the current saturates when the channel voltage $V_{ds}$ exceeds the saturation voltage $V_{ds,sat}$. $I_{ds}$ is substantially independent of $V_{ds}$ when the NMOS transistor is in this saturation mode.

An extended drain metal oxide semiconductor (ED-MOS) transistor is characterized by a relative high specific on resistance ($R_{ON}$) especially in comparison to a laterally diffused metal oxide semiconductor (LD-MOS) transistor. However, the ED-MOS is characterized as having a reduced number of mask layers over the LD-MOS. Conventionally, the breakdown voltage of the ED-MOS and LD-MOS have been increased by reducing the concentration of dopant in the drift region or increasing the length of the drift region. This results in an increase in the $R_{ON}$.

Thus, without intending to be limiting, conventionally the current of MOS transistors may depend upon the type of dopant and the extent of doping in any of the regions of the semiconductor, the dielectric thickness and the dielectric material, and the gate material. Moreover, as disclosed herein, conventional changes in the design of the MOS transistor that increase the breakdown voltage also increase the $R_{ON}$.

There remains a need in the art for a MOS design that increases the breakdown voltage but without substantially affecting the $R_{ON}$ of the MOS transistor. Conversely, there remains a need in the art to reduce the $R_{ON}$ without substantially changing a desired breakdown voltage of the MOS transistor.

Furthermore, a long-felt need in the art has been to reduce the size of power semiconductor devices still having increased breakdown voltages yet without substantially compromising the $R_{ON}$.

BRIEF SUMMARY OF EXEMPLARY EMBODIMENTS

Embodiments of devices of the present invention may also be provided that are directed to a semiconductor device having reduced specific $R_{ON}$ without substantially affecting a breakdown voltage of the device.

An aspect of the invention provides a semiconductor device, for example, a metal oxide semiconductor (MOS) device, comprising a substrate, a well disposed in the substrate, a doped shallow drain implant disposed in the well substantially across a drift region, and a conductive layer separated from the substrate in part by a thin oxide layer and in another part by a thick/thin oxide layer. According to an embodiment of the invention, a thickness of the thin oxide layer may be less than a thickness of the thick/thin oxide layer. Further pursuant to this embodiment of the invention, the thickness of the thin oxide layer is from about 30 Å to about 180 Å and the thickness of the thick/thin oxide layer is from about 120 Å to about 1100 Å.

In an embodiment of the invention the semiconductor device may additionally comprise a high temperature oxide (HTO) layer disposed substantially across the thick/thin oxide layer. In certain embodiments of the invention, the semiconductor device is an extended drain n-channel metal oxide semiconductor (ED-NMOS) device. Further pursuant to this embodiment, the well of the ED-NMOS device is a p well (PW) while the doped shallow drain implant is an n doped shallow drain (NDD) implant.

In certain embodiments of the invention, a concentration of a dopant in the NDD implant is from about $5 \times 10^{12}$ atoms/cm$^2$ to about $1 \times 10^{14}$ atoms/cm$^2$. According to an embodiment of the invention, a slope of a channel current ($I_{ds}$) versus a channel voltage ($V_{ds}$) as the ED-NMOS device transitions from a linear response to saturation is at least about $6 \times 10^{-5}$ A/μm-V.

According to an embodiment of the invention, the semiconductor device may comprise an n-type well deep (NWD) implant disposed in the substrate with the PW disposed in this NWD implant. In certain embodiments of the invention, the ED-NMOS device additionally comprises a source region having a source side n+ doped region disposed in the PW and a source side p+ doped region disposed in the PW, a channel region defined by the source region and the drift region, and a drain region having a drain side n+ doped region disposed in the NDD implant where the drain region is adjacent to the drift region at a side opposite the channel region.

In an embodiment of the invention, the source side p+ doped region may be configured to be a square p+ doped region having a plurality of p+ squares surrounded by the source side n+ doped region. In another embodiment of the invention, the semiconductor device may additionally comprise a p drift implant disposed in the NDD implant. In yet other embodiments, an ED-NMOS of the invention having both a p drift implant disposed in the NDD implant and a square p+ doped region having a plurality of p+ squares distributed such that none of the plurality of p+ squares is aligned with the p drift implant.

The semiconductor device of the invention may additionally comprise an n-channel threshold voltage adjust ($NV_t$) implant disposed in at least a portion of the NDD implant proximate to a surface of the substrate.

In an embodiment of the invention, the semiconductor device may additionally comprise at least one but, in certain embodiments, a plurality of isolation structures. For example, in certain embodiments of the invention, a first isolation structure is adjacent to the channel region at a side opposite to the channel region and a second isolation structure is adjacent to the drain region at another side opposite the drift region. In yet certain other embodiments of the invention, a third isolation structure is defined by a gate region and the drain region and is substantially aligned with the drift region. According to any of these aforementioned embodiments of the invention, these isolation structures may be any of a field oxide (FOX) layer, a shallow trench isolation structure, and any combination thereof.

An aspect of the invention provides a method of fabricating a semiconductor device. In a more specific embodiment of the invention, a method for manufacturing an extended drain n-channel metal oxide semiconductor (ED-NMOS) comprises providing a substrate, implanting an n-type well deep (NWD) implant in the substrate, driving in a dopant of the NWD implant, implanting a p well (PW) into the NWD implant, driving in a dopant of the PW, and implanting an n doped shallow drain (NDD) implant in the p well to substantially define a drift region disposed between a channel region on one side and a drain region on an other side, the channel region adjacent to a source region.

In an embodiment of the invention, the method of fabricating the ED-NMOS may additionally comprise forming an isolation region in the ED-NMOS device. In certain embodiments of the invention, the isolation region has any one of a field oxide (FOX) layer, a shallow trench isolation structure, and any combination thereof.

The method of fabricating the ED-NMOS device, according to an embodiment of the invention, may additionally comprise the steps of forming a thick oxide layer across the substrate, etching the thick oxide layer such that it is disposed above at least a portion of the drift region, forming a thin oxide layer disposed across the substrate and the thick oxide layer, the thin oxide layer and the thick oxide layer forming a thick/thin oxide layer, and disposing a conductive layer across a portion of the thin oxide layer and another portion of the thick/thin oxide layer.

In certain embodiments of the invention, the method of fabricating the ED-NMOS device may optionally comprise implanting a source side n-doped region in the PW, etching the thick/thin oxide layer, implanting a source side n+ doped region and a source side p+ doped region to define a contact for the source region, and implanting a drain side n+ doped region to define another contact for the drain region.

An additional aspect of the invention provides an extended drain metal oxide semiconductor (ED-MOS) transistor manufactured according to the methods of the invention.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a MOS device" includes a plurality of such MOS devices.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

Figure 1:
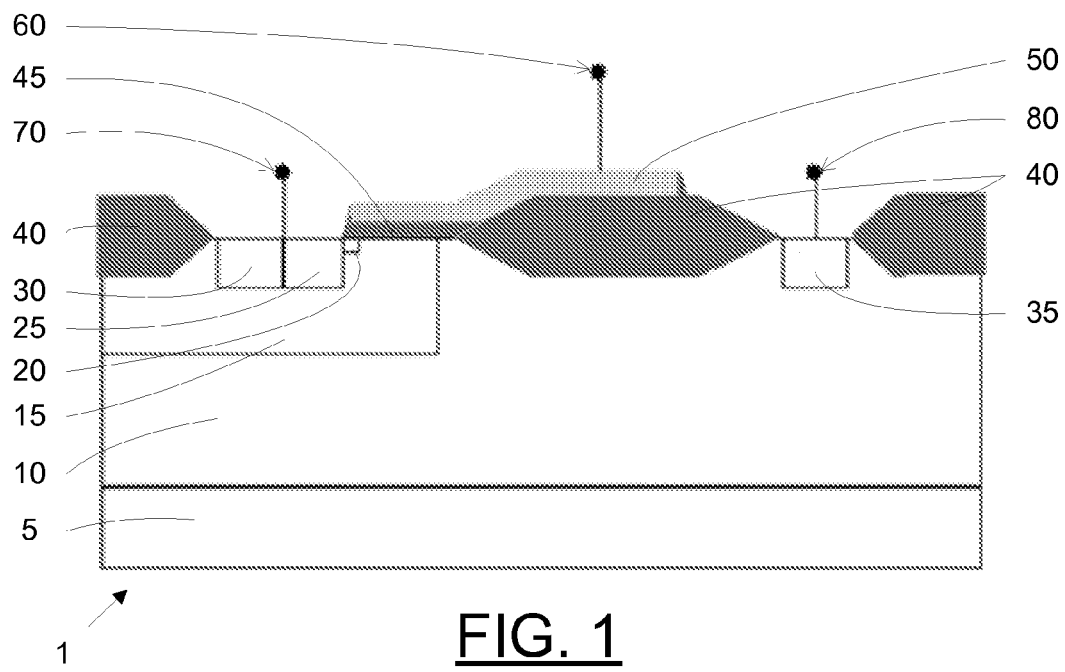
FIG. 1 illustrates a cross-sectional view of a conventional extended drain n-type metal oxide semiconductor (ED-NMOS) device.
Figure 2A:
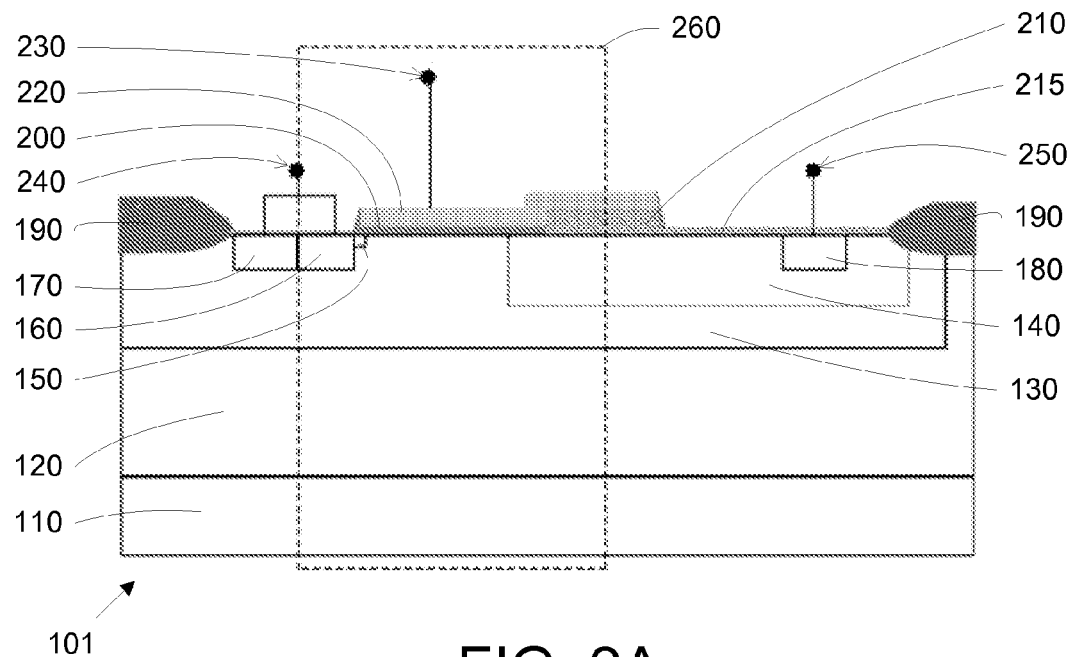
FIG. 2A illustrates a cross-sectional view of an ED-NMOS device according to an embodiment of the invention.

The inventors have conceived of a novel structure for a MOS controlled power semiconductor device. FIG. 2A is an exemplary illustrative embodiment of a cross-section of an extended drain n-type metal oxide semiconductor (ED-NMOS) device according to an embodiment of the invention. The exemplary ED-NMOS device 101 of FIG. 2A has a substrate 110, for example a p-type substrate or even a p-type epitaxial (p-epi) layer, upon which is disposed an n-type well deep (NWD) 120 implant. A p well (PW) 130 is disposed within the NWD 120 at a source region 240. An n-doped shallow drain (NDD) implant 140 is disposed in the PW 130 substantially across a drift region extending into a drain region 250. Optionally, a source side n-doped region 150 may be disposed in the PW 130.

While the source side n-doped region 150 is optional for any of the ED-NMOS devices of the invention, embodiments of the invention directed to lightly doped drain n-channel metal oxide semiconductors (LDD NMOS) generally require the source side n-doped region. With respect to ED-PMOS devices of the invention, a source side p-doped region is optional; however, embodiments of the invention directed to lightly doped drain p-channel metal oxide semiconductors (LDD PMOS) generally require the source side p-doped region.

The ED-NMOS device 101 of FIG. 2A also comprises a source side n+ doped region 160 and a source side p+ doped region 170 disposed in the PW 130 at the source region 240 to form a source contact area. A drain side n+ doped region 180 is disposed in the NDD implant 140 to define a contact area for the drain region 250.

In exemplary embodiments of the invention, a concentration of dopant of the NDD implant 140 may be from about $1 \times 10^{12}$ atoms/cm$^2$ to about $5 \times 10^{15}$ atoms/cm$^2$. In certain embodiments of the invention, the concentration of dopant of the NDD implant 140 is from about $5 \times 10^{12}$ atoms/cm$^2$ to about $1 \times 10^{14}$ atoms/cm$^2$.

A dielectric layer 190 defines an outer bound of the source side p+ doped region 170 of the contact area for the source region 240 and an outer bound of the drain side n+ doped region 180 at the drain region 250. In one embodiment of the invention, the dielectric layer 190 may be a field oxide (FOX) layer. In certain embodiments of the invention, the dielectric layer 190 may be configured to function as an isolation structure.

In one embodiment of the invention, an isolation structure may be adjacent to a side of the drain region that opposes another side of the drain region adjacent to the drift region. In another embodiment of the invention, an isolation region may be adjacent to a side of the source region that opposes another side of the source region adjacent to the channel region.

A thin oxide layer 200 is disposed across part of the substrate beginning about where the contact area of the source region 240 ends at the source side n+ doped region 160 and continuing through the gate region 230 to about where a thick/thin oxide layer 210 begins. A conductive layer 220 is disposed across a portion of the thin oxide layer 200 and the thick/thin oxide layer 210. The thick/thin oxide layer 210 is adjacent to an etched oxide layer 215. The etched oxide layer 215 continues from the thick/thin oxide layer 210 and continues across the drain region 250 until it contacts the dielectric layer 190 at the opposing side of the drain region 250. In certain embodiments of the invention, the drain region 250 contacts the n+ doped region 180 by material.

According to an exemplary embodiment of the invention, the substrate may be a non-epitaxial layer, for example, either a p type substrate or an n type substrate. In certain other embodiments of the invention, the substrate may be an epitaxial layer or may include an epitaxial layer, for example, a p type epitaxial (p-epi) layer or an n type epitaxial (n-epi) layer. In yet other embodiments of the invention, the substrate may be a silicon on insulator (SOI) structure either, for example a p type or an n type SOI structure.

According to certain embodiments of the invention, the gate material of the two conductive layer structure may be a polysilicon, a metal, or a silicide polysilicon. The inter-poly insulator may be an oxide or an oxide-nitride-oxide (ONO) or a high K insulator. In certain embodiments of the invention, the first conductive layer and the second conductive layer may be configured to have substantially the same bias voltages. In certain other embodiments of the invention, the first conductive layer and the second conductive layer may be configured to have different bias voltages.

Without intending to be bound by theory, the MOS structure of the invention increases the breakdown voltage between the gate region 230 and the drain region 250 and the current flow path in the drift region is effectively reduced to decrease the $R_{ON}$ of the device in comparison to a conventional extended drain metal oxide semiconductor field effect transistor (EDMOSFET).

Figure 2B:
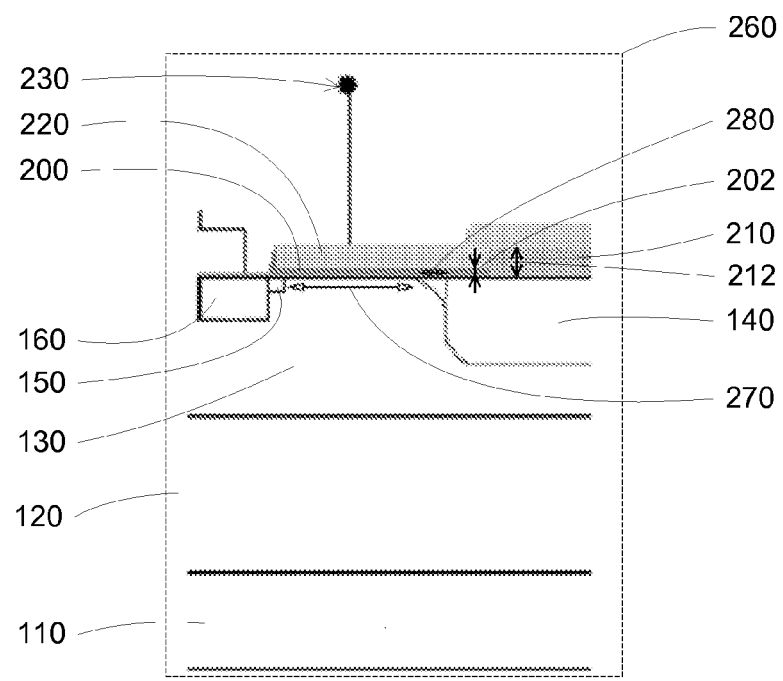
FIG. 2B is a detail view of a portion of the ED-NMOS device of FIG. 2A.

FIG. 2B illustrates a detail view of the region 260 identified in FIG. 2A. In particular, FIG. 2B shows the effective channel length 270, which, without intending to be bound by theory, is reduced as a result of the NDD implant 140. A length 280 of a diffusion boundary approximately at the surface of the NDD implant 140 may extend from about 0.1 μm to about 1 μm. FIG. 2B also identifies a thickness 202 of the thin oxide layer 200 and a thickness 212 of the thick/thin oxide layer 210.

Without intending to be bound by theory, p-type dopants, such as boron, for example, may tend to diffuse out after thermal processing, having an effect on substrate formation. In exemplary embodiments of the invention, implantation process techniques to reduce the extent of p-type dopant substrates leaving the substrate upon subsequent thermal processing may be utilized.

In certain embodiments of the invention, the thickness 202 of the thin oxide layer 200 is less than the thickness 212 of the thick/thin oxide layer 210. In certain other embodiments of the invention, the thickness 212 of the thin oxide layer 200 may be substantially less than the thickness 212 of the thick/thin oxide layer 210. In exemplary embodiments of the invention, the thickness 202 of the thin oxide layer 200 may be from about 20 Å to about 250 Å. In certain other exemplary embodiments of the invention, the thickness 202 of the thin oxide layer 200 is from about 30 Å to about 180 Å. According to exemplary embodiments of the invention, the thickness 212 of the thick/thin oxide layer 210 may be from about 95 Å to about 1,500 Å. In certain other exemplary embodiments of the invention, the thickness 212 of the thick/thin oxide layer 210 is from about 120 Å to about 1,100 Å.

Figure 3A:
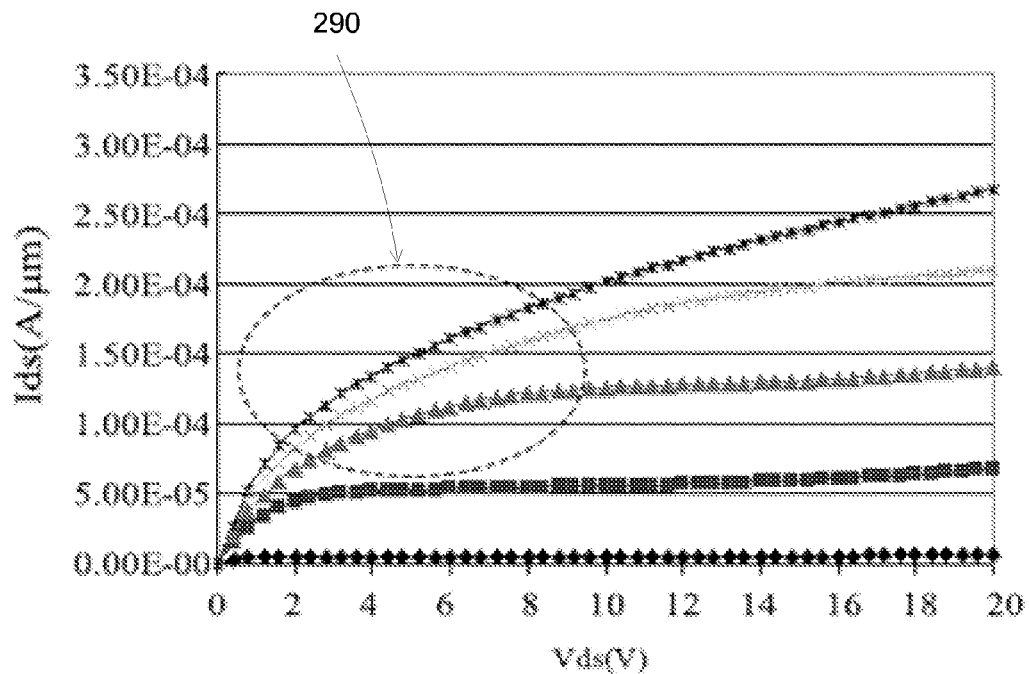
FIG. 3A illustrates a graphical representation of a channel current $I_{ds}$ versus a channel voltage $V_{ds}$ for conventional ED-NMOS devices.

The design of the semiconductor devices contemplated by the inventors results in a reduction of the quasi-saturation effect when compared to conventional semiconductor devices. FIG. 3A illustrates a graphical representation of a channel current $I_{ds}$ versus a channel voltage $V_{ds}$ for conventional ED-NMOS devices. As shown in FIG. 3A, conventional ED-NMOS devices exhibit a relatively strong quasi-saturation effect. As shown in region 290 a strong quasi-saturation effect is marked by a relatively small slope as the device transitions from a generally linear response to saturation.

Figure 3B:
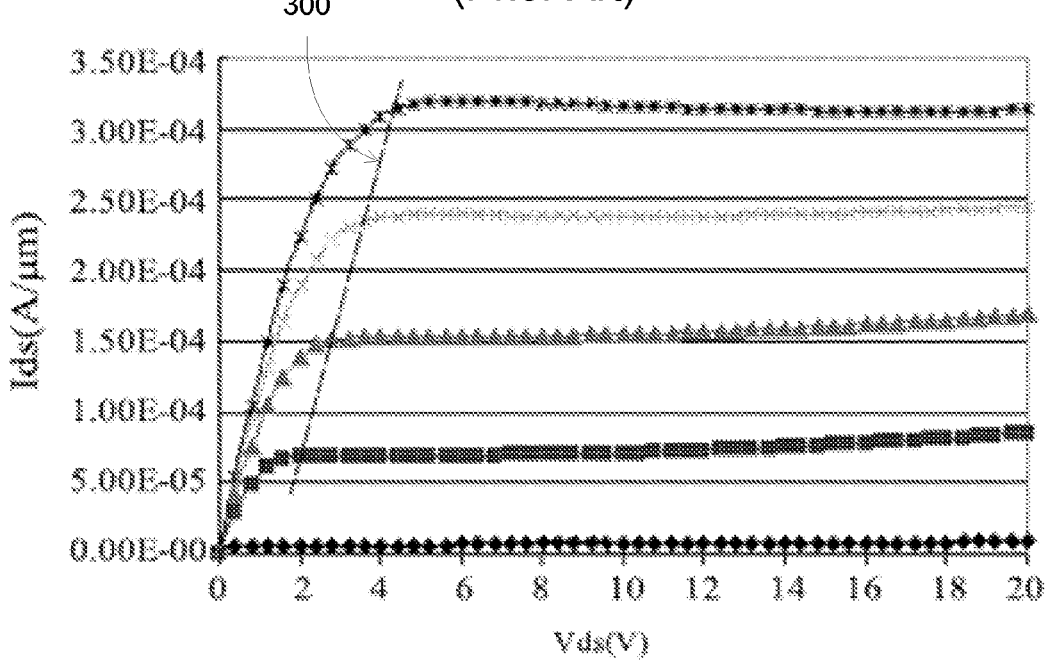
FIG. 3B illustrates a graphical representation of a channel current $I_{ds}$ versus a channel voltage $V_{ds}$ for an ED-NMOS device according to certain embodiments of the invention.

By comparison, FIG. 3B illustrates a graphical representation of a channel current $I_{ds}$ versus a channel voltage $V_{ds}$ for an ED-NMOS device according to certain embodiments of the invention. As shown in FIG. 3B, an ED-NMOS of the invention may substantially eliminate the quasi-saturation effect and may be characterized by a larger slope as the device transitions from a linear response to saturation relative to the slopes exhibited by conventional devices. In an embodiment of the invention, the slope of the curve, as a device of the invention transitions from a linear response to saturation, may be more than twice the slope of a conventional device. In certain embodiments of the invention, the slope of $I_{ds}$ versus $V_{ds}$ as the device transitions from a generally linear response approaching saturation is at least about $6 \times 10^{-5}$ A/μm-V.

Figure 4:
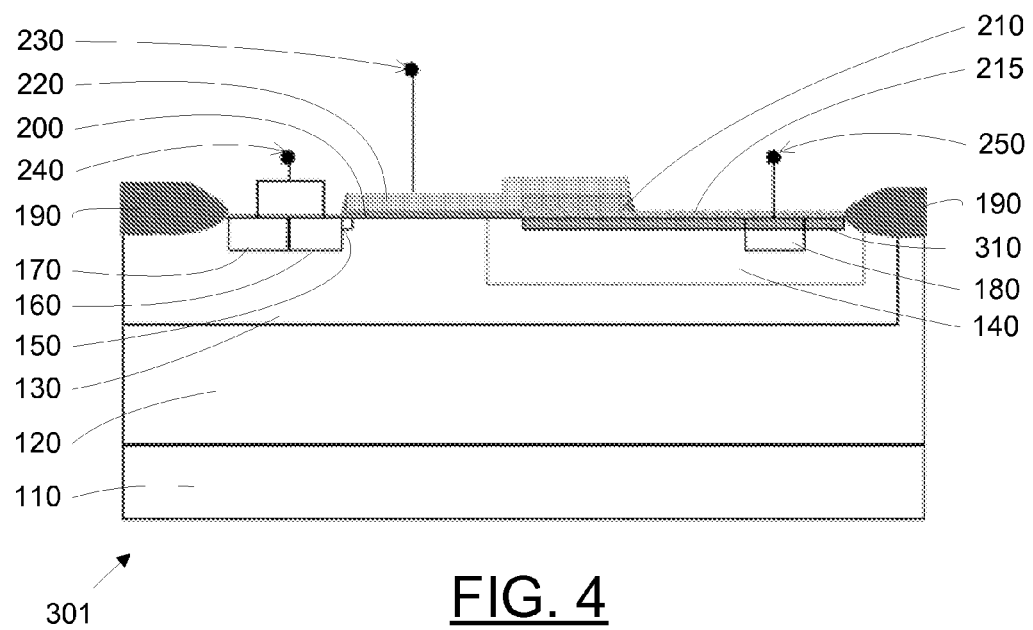
FIG. 4 illustrates a cross-sectional view of an ED-NMOS device according to another embodiment of the invention.

FIG. 4 illustrates a cross-sectional view of an ED-NMOS device according to another embodiment of the invention. According to the embodiment of FIG. 4, in addition to having the NDD implant 140 of FIG. 2A, for example, the ED-NMOS device 301 additionally comprises an n-channel threshold voltage adjust (NVT) implant 310. THE NVT implant 310, according to an embodiment of the invention, may be disposed in at least a portion of the NDD implant 140 proximate to a surface of the substrate 110 as shown in the exemplary embodiment of FIG. 4. Without intending to be bound be theory, the NVT implant 310 may, in an embodiment of the invention, result in a reduction specific $R_{ON}$. In exemplary embodiments of the invention, the concentration of dopant in the NVT implant 310 may range from about $1 \times 10^{12}$ atoms/cm² to about $5 \times 10^{15}$ atoms/cm². In certain other embodiments of the invention, the concentration of dopant in the NVT implant 310 may be in a range of from about $5 \times 10^{12}$ atoms/cm² to about $1 \times 10^{14}$ atoms/cm².

Figure 5:
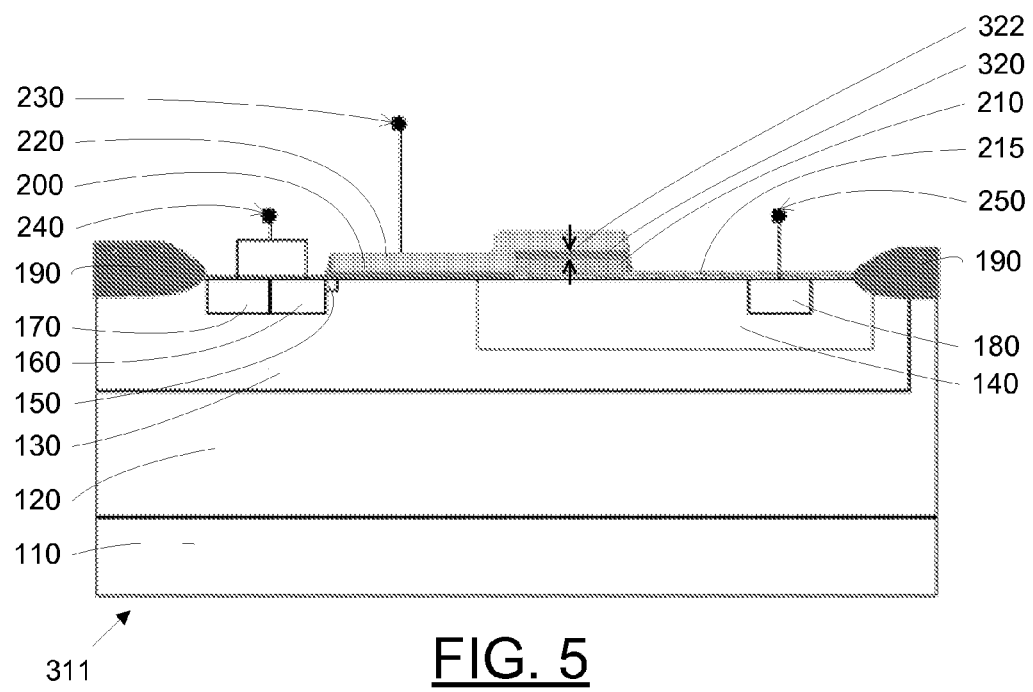
FIG. 5 illustrates a cross-sectional view of an ED-NMOS device according to another embodiment of the invention.

FIG. 5 illustrates a cross-sectional view of an ED-NMOS device according to another embodiment of the invention. According to the embodiment of FIG. 5, in addition to having the NDD implant 140 of FIG. 2A, for example, the ED-NMOS device 311 additionally comprises a high temperature oxide (HTO) layer 320 disposed substantially along the thick/thin oxide layer 210 and between the thick/thin oxide layer 210 and the conductive layer 220. According to exemplary embodiments of the invention, a thickness 322 of the HTO layer 320 may be from about 120 Å to about 600 Å. In certain other embodiments of the invention, the thickness 322 of the HTO layer 320 is from about 180 Å to about 500 Å.

Figure 6:
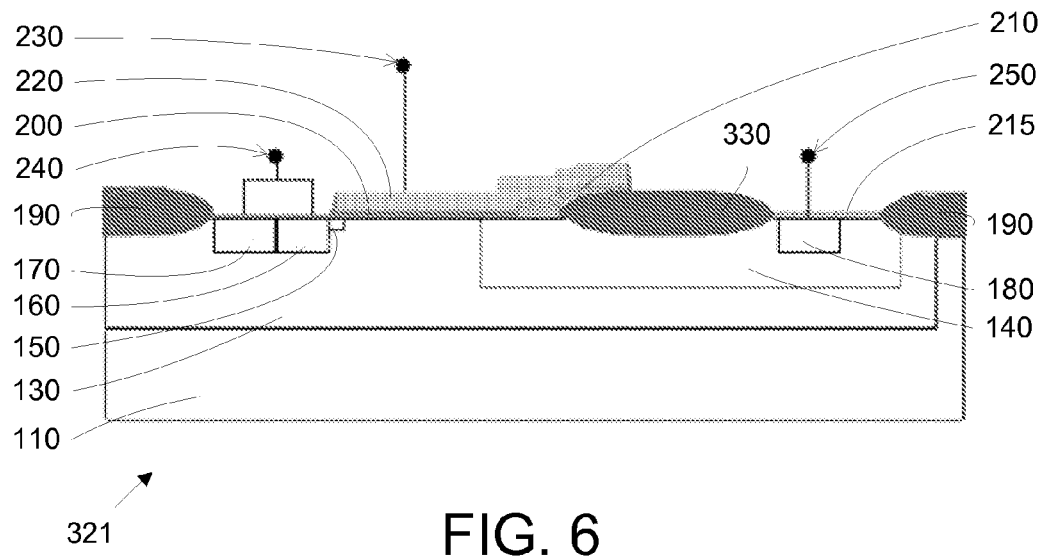
FIG. 6 illustrates a cross-sectional view of an ED-NMOS device according to another embodiment of the invention.

FIG. 6 illustrates a cross-sectional view of an ED-NMOS device according to another embodiment of the invention. According to the embodiment of FIG. 6, in addition to having the NDD implant 140 of FIG. 2A, for example, the ED-NMOS device 321 comprises a field oxide (FOX) layer 330 patterned to form an isolation structure between the gate region 230 and the drain region 250, as shown in FIG. 6 substantially aligned with the drift region. Without intending to be bound by theory, in an embodiment of the invention, the ED-NMOS device 321 having the additional isolation structure formed using the FOX layer 330 may improve the drain-to-gate breakdown voltage ($V_{BD}$).

Figure 7:
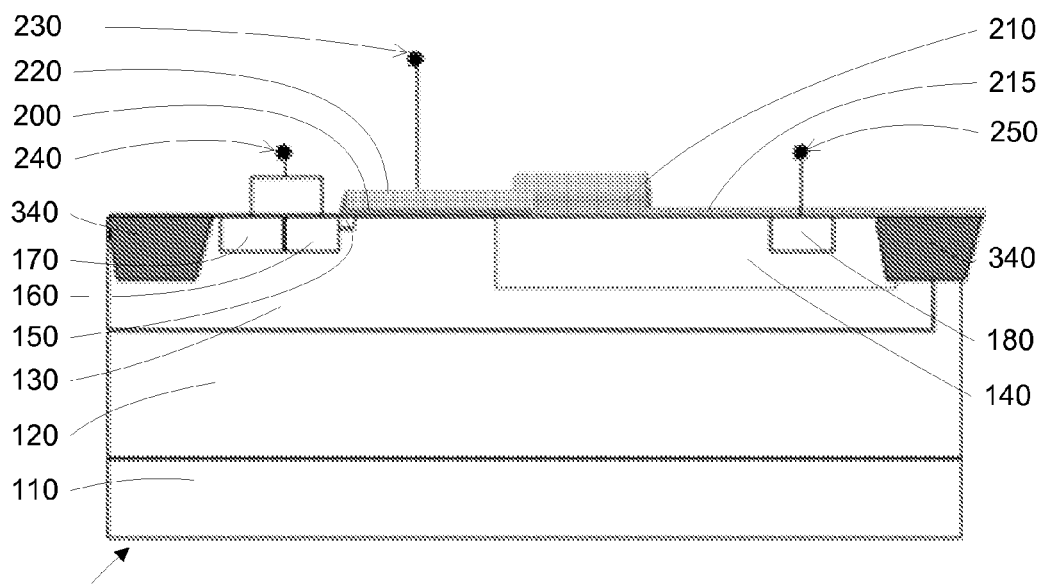
FIG. 7 illustrates a cross-sectional view of an ED-NMOS device according to another embodiment of the invention.

FIG. 7 illustrates a cross-sectional view of an ED-NMOS device according to another embodiment of the invention. The embodiment of an ED-NMOS device 331 represented in FIG. 7 is similar to the embodiment of the ED-NMOS device 101 represented by FIG. 2A except that the dielectric layer 190, such as a field oxide layer, intended to provide an isolation structure has been replaced by a shallow trench isolation (STI) structure 340 as shown in the exemplary embodiment of FIG. 7.

According to certain embodiments of the invention, the isolation structures of the device may include one or more shallow trench isolation (STI) structures. In certain embodiments of the invention, the isolation structure may comprise a field oxide layer and one or more STI structures.

Inasmuch, the STI structure 340 of FIG. 7 is merely one exemplary embodiment showing the use of an STI structure arrangement. Non-limiting examples of other structures encompassed by the invention include local oxidation of silicon (LOCOS) process to provide isolation of the device edge, for example; shallow trench isolation (STI) process for isolation of the device edge, for example; deep trench isolation (DTI) process for isolation of the device edge, for example; silicon on insulator (SOI) process for isolation of the device edge and/or the device substrate, for example; n epitaxial (n-epi) or p epitaxial (p-epi) layers for isolation of the device substrate, for example; and even non-epitaxial process.

In certain exemplary embodiments of the invention, a dual gate oxide design and a multi-reduced surface field (RE-SURF) is adopted in an n-channel extended drain metal oxide semiconductor (ED-NMOS). In certain other exemplary embodiments, the dual gate oxide design and multi-RESURF of the invention may be adopted in a p-channel extended drain metal oxide semiconductor (ED-PMOS). In certain other embodiments of the invention, the inventive structure adopted for the ED-MOS may also be applied to either an n-channel laterally diffused metal oxide field effect transistor (LDMOS-FET) or a p-channel LDMOSFET.

Figure 8:
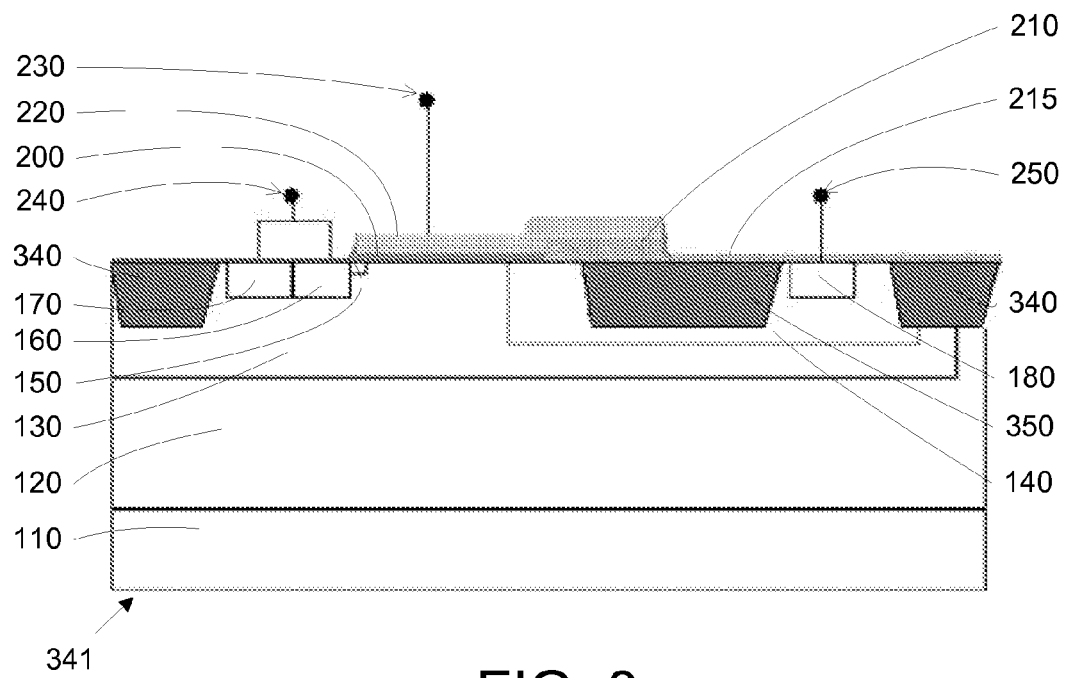
FIG. 8 illustrates a cross-sectional view of an ED-NMOS device according to another embodiment of the invention.

FIG. 8 illustrates a cross-sectional view of an ED-NMOS device according to another embodiment of the invention. According to the embodiment of FIG. 8, in addition to having the NDD implant 140 of FIG. 7, for example, the ED-NMOS device 341 additionally comprises another STI structure 350 disposed in the drift region of the device. Without intending to be bound by theory, the another STI structure 350 of the ED-NMOS device 341 of FIG. 8 may improve the drain to gate breakdown voltage ($V_{BD}$) according to certain embodiments of the invention.

Figure 9:
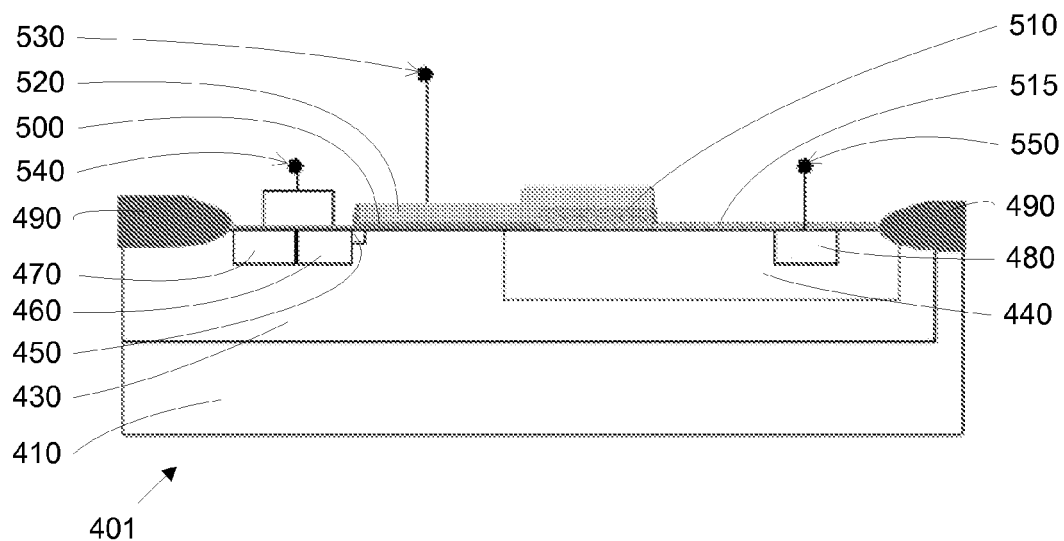
FIG. 9 illustrates a cross-sectional view of a low side n-channel metal oxide semiconductor (NMOS) device according to another embodiment of the invention.

FIG. 9 illustrates a cross-sectional view of an NMOS device according to another embodiment of the invention. The exemplary embodiment of a low side NMOS device 401 of FIG. 9 shows how the NWD implant 120 may be replaced with only a p well (PW) to form the low side NMOS device 401. The low side NMOS 401 of FIG. 9 comprises a substrate 410 having a PW 430 disposed therein. The low side NMOS device 401 additionally comprises an NDD implant 440 disposed in the PW 430 substantially across a drift region extending into a drain region 550, which is characteristic of certain devices of the invention.

Optionally, a source side n-doped region 450 may be disposed in the PW 430. While the source side n-doped region 450 is optional for any of the low side NMOS devices of the invention, embodiments of the invention directed to lightly doped drain n-channel metal oxide semiconductors (LDD NMOS) generally require the source side n-doped region. With respect to low side PMOS devices of the invention, a source side p-doped region is optional; however, embodiments of the invention directed to lightly doped drain p-channel metal oxide semiconductors (LDD PMOS) generally require the source side p-doped region.

The low side NMOS device 401 of FIG. 9 also comprises a source side n+ doped region 460 and a source side p+ doped region 470 disposed in the PW 430 at the source region 540 to form a source contact area. A drain side n+ doped region 480 is disposed in the NDD implant 440 to define a contact area for the drain region 550.

In exemplary embodiments of the invention, a concentration of dopant of the NDD implant 440 may be from about $1\times10^{12}$ atoms/cm$^2$ to about $5\times10^{15}$ atoms/cm$^2$. In certain other embodiments of the invention, the concentration of dopant of the NDD implant 440 may be from about $5\times10^{12}$ atoms/cm$^2$ to about $1\times10^{14}$ atoms/cm$^2$.

A dielectric layer 490 defines an outer bound of the source side p+ doped region 470 of the contact area for the source region 540 and an outer bound of the drain side n+ doped region 480 at the drain region 550. In exemplary embodiments of the invention, the dielectric layer 490 may be a field oxide (FOX) layer.

A thin oxide layer 500 is disposed across part of the substrate beginning about where the contact area of the source region 540 ends at the source side n+ doped region 460 and continuing through the gate region 530 to about where a thick/thin oxide layer 510 begins. A conductive layer 520 is disposed across a portion of the thin oxide layer 500 and the thick/thin oxide layer 510. The thick/thin oxide layer 510 is adjacent to an etched oxide layer 515. The etched oxide layer 515 continues from the thick/thin oxide layer 510 and continues across the drain region 550 until it contacts the dielectric layer 190 at the opposing side of the drain region 550.

Figure 10A:
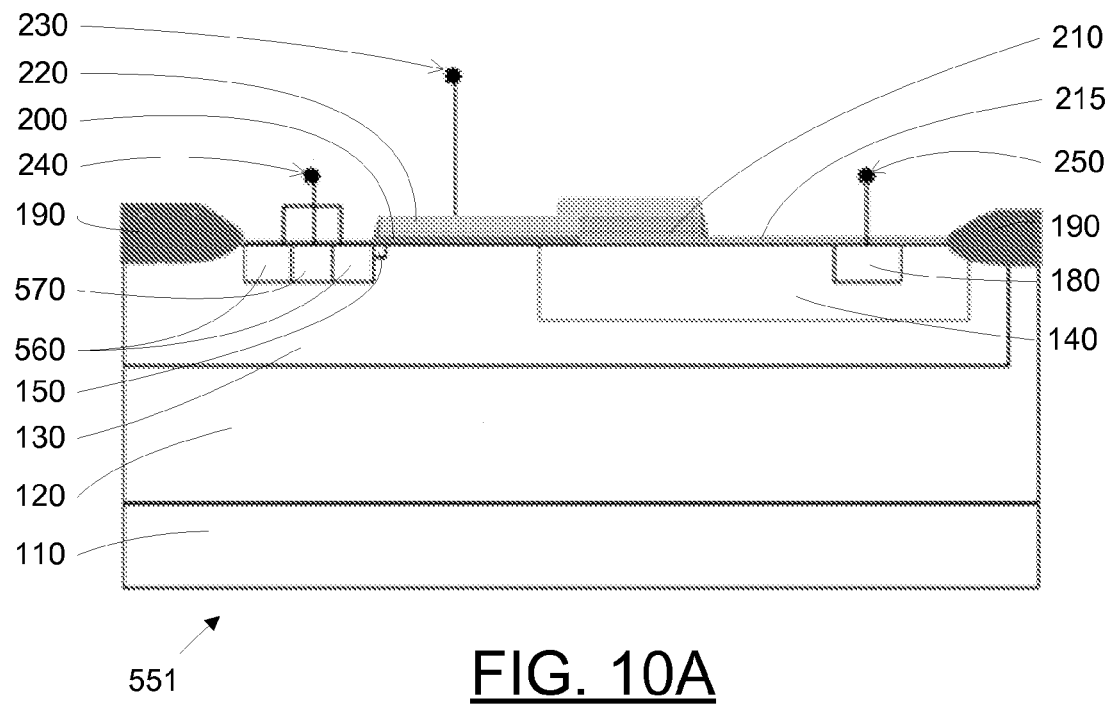
FIG. 10A illustrates a cross-sectional view of am ED-NMOS device according to another embodiment of the invention.
Figure 10B:
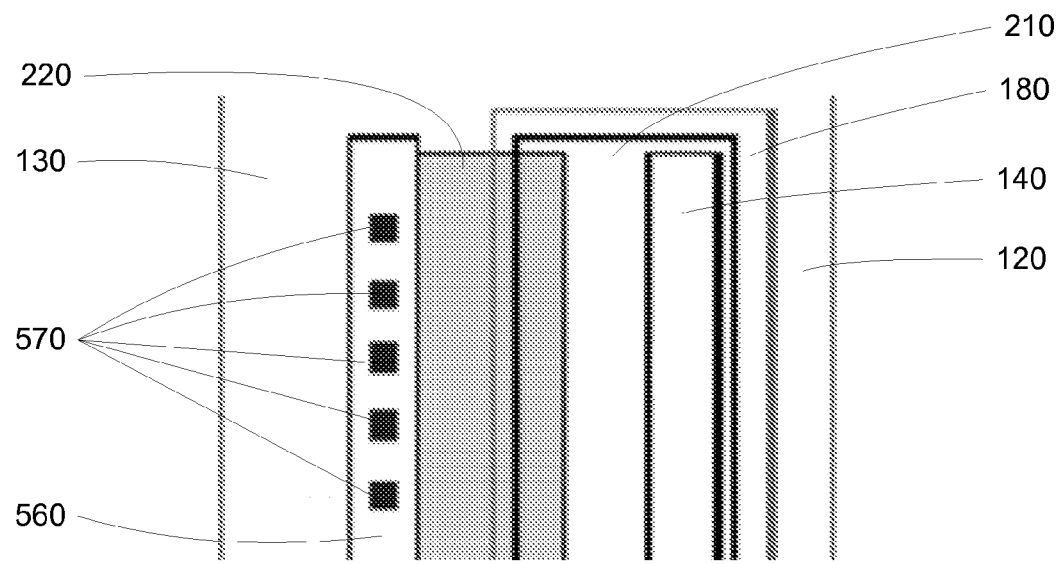
FIG. 10B illustrates a top view of the ED-NMOS device of FIG. 10A.

FIG. 10A illustrates a cross-sectional view of an ED-NMOS device according to another embodiment of the invention similar to the embodiment of FIG. 2A. The ED-NMOS device 551 of FIG. 10A has a square p+ doped region 570 where the plurality of p+ squares of the p+ doped region 570 are surrounded by an n+ doped region 560 at the source region 240. Without intending to be bound by theory, the square p+ doped region 570 may allow the area of the ED-NMOS device 551 to become further reduced. FIG. 10B illustrates a top view of the ED-NMOS device 551 of FIG. 10A showing the distribution of the square p+ doped region 570 at the source side.

Figure 11A:
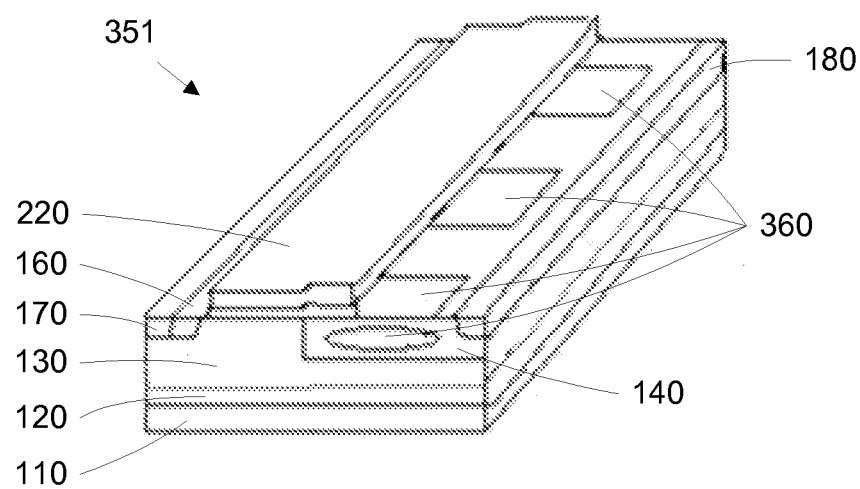
FIG. 11A illustrates an isometric view of an ED-NMOS device according to another embodiment of the invention.
Figure 11B:
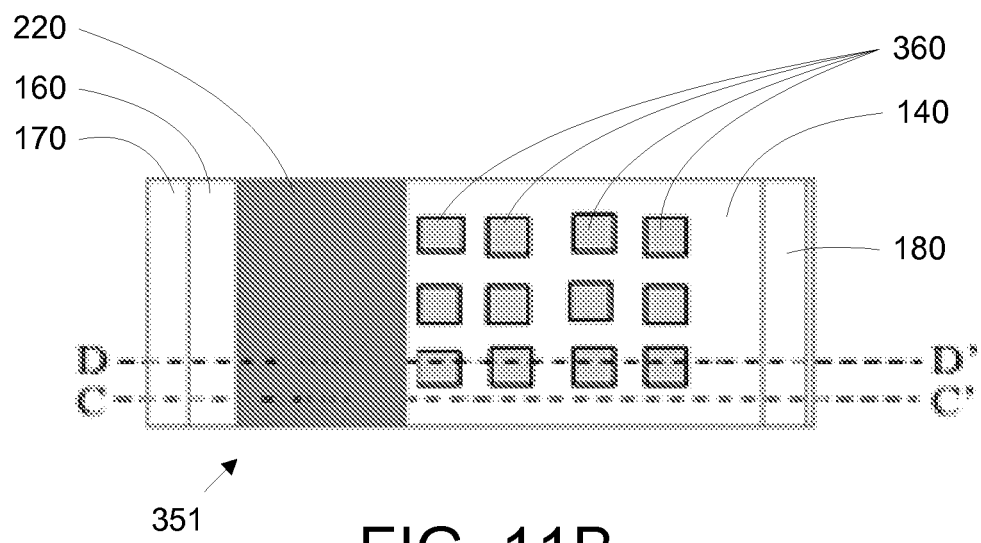
FIG. 11B illustrates a top view of the ED-NMOS device of FIG. 11A.

FIG. 11A illustrates an isometric view of an ED-NMOS device according to another embodiment of the invention. The ED-NMOS device 351 of FIG. 11A comprises a p drift implant 360 disposed in the NDD implant 140 in a multi-RESURF layer configuration of the ED-NMOS device 351. FIG. 11B illustrates a top view of the ED-NMOS device 351 of FIG. 11A. FIG. 11B shows the discretized distribution of the p draft implant 360 across the ED-NMOS device 351.

Figure 11C:
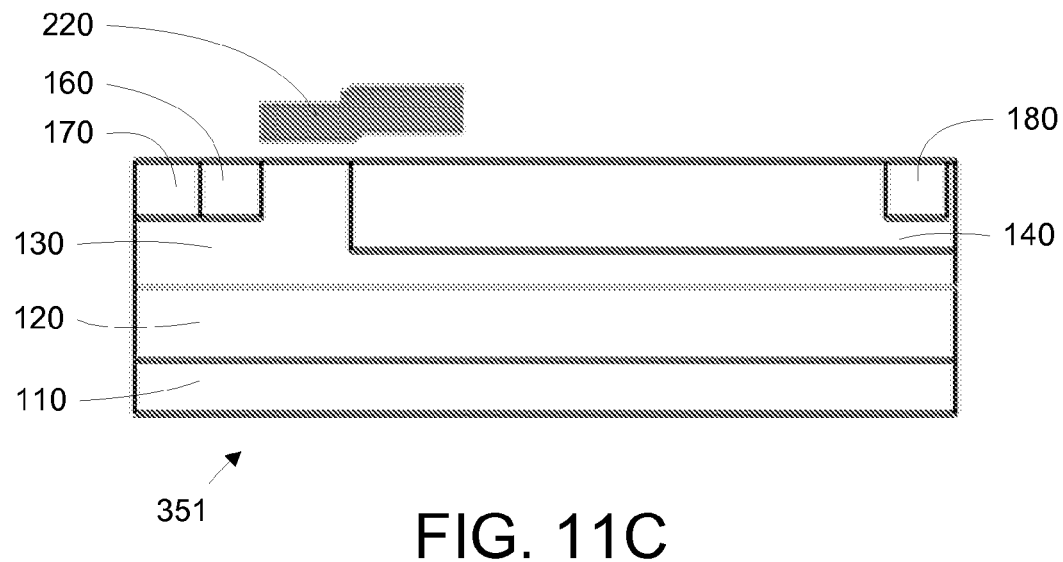
FIG. 11C illustrates a cross-sectional view of the ED-NMOS device of FIG. 11B taken along the CC' section line.
Figure 11D:
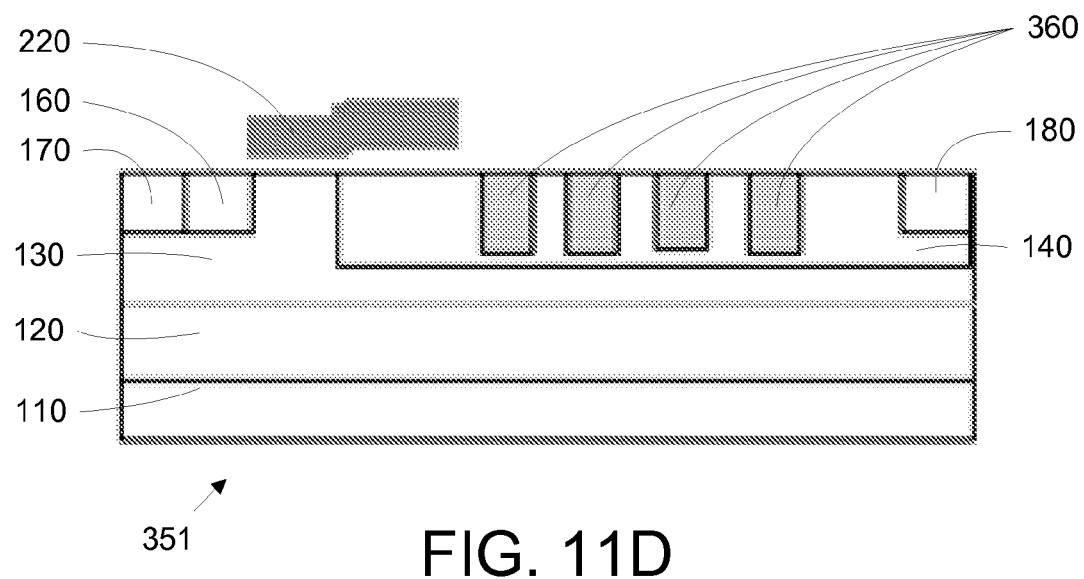
FIG. 11D illustrates a cross-sectional view of the ED-NMOS device of FIG. 11B taken along the DD' section line.

FIG. 11C illustrates a cross-sectional view of the ED-NMOS device 351 of FIG. 11B taken along the C-C' section line. FIG. 11D illustrates a cross-sectional view of the ED-NMOS device 351 of FIG. 11B taken along the D-D' section line. As shown in FIG. 11C, in this region of the semiconductor, there is no p drift implant 360. On the other hand, the region of the ED-NMOS device 351 of FIG. 11D shows the distribution of the discretized segments of the p drift implant 360.

Figure 12A:
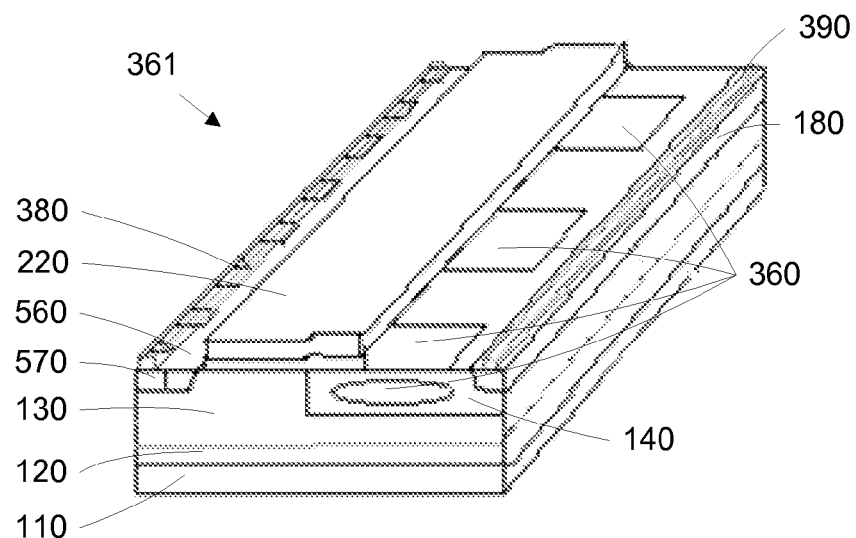
FIG. 12A illustrates an isometric view of an ED-NMOS device according to another embodiment of the invention.

FIG. 12A illustrates an isometric view of an ED-NMOS device according to another embodiment of the invention. The ED-NMOS device 361 has a multi-RESURF layer that is similar to the configuration of FIG. 11A. However, the ED-NMOS device of FIG. 12A is configured to have a square p+ doped region 570 that is configured to alternative with the discretized p drift implant 360. The ED-NMOS device 361 also comprises a first conductive lead 380 distributed across the source region and a second conductive lead 390 distributed across the drain region.

Figure 12B:
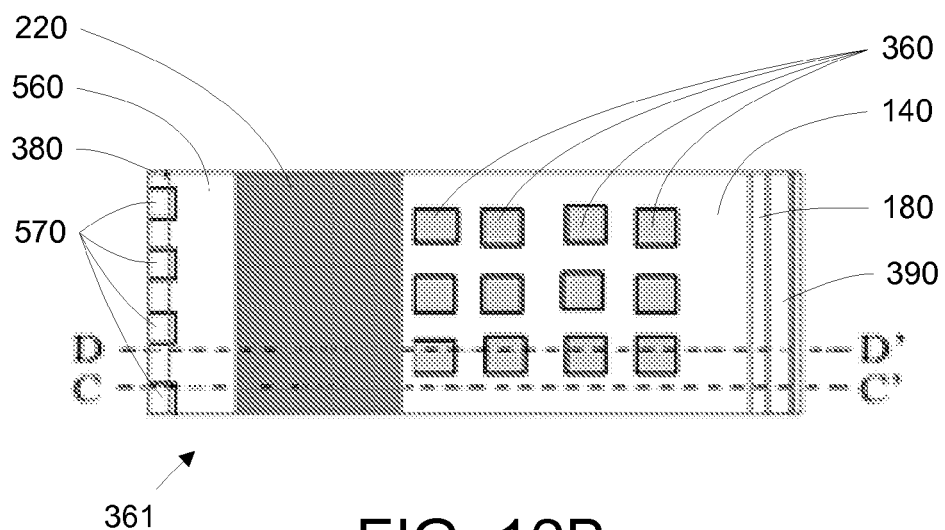
FIG. 12B illustrates a top view of the ED-NMOS device of FIG. 12A.
Figure 12C:
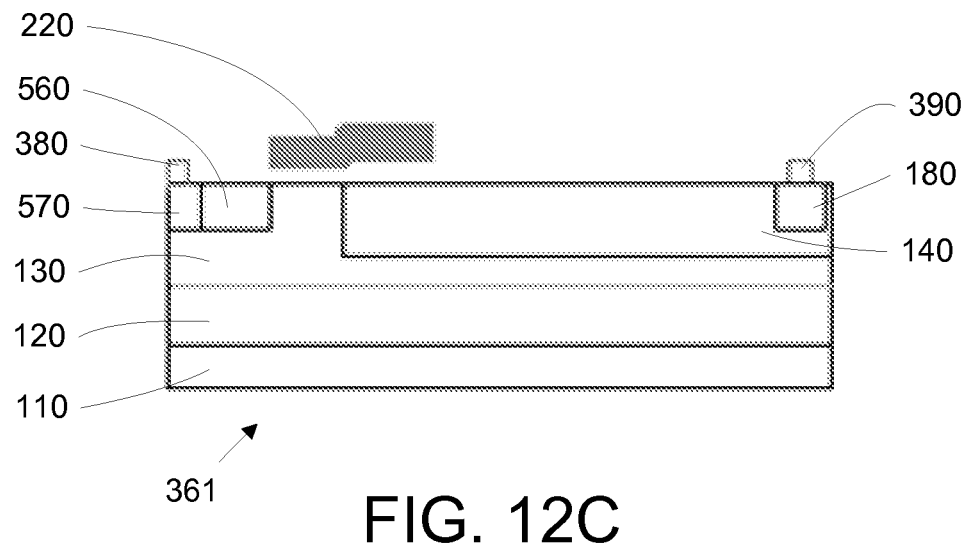
FIG. 12C illustrates a cross-sectional view of the ED-NMOS device of FIG. 12B taken along the CC' section line.
Figure 12D:
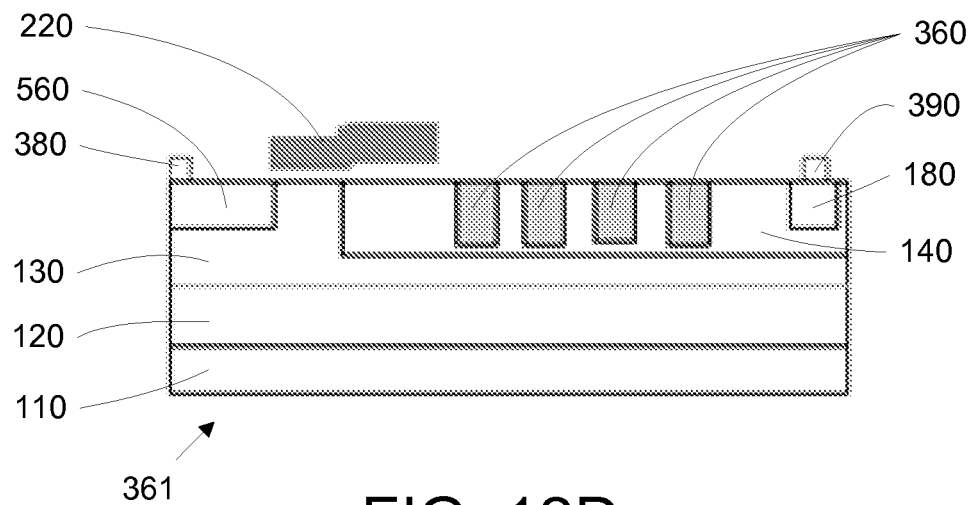
FIG. 12D illustrates a cross-sectional view of the ED-NMOS device of FIG. 12B taken along the DD' section line.

By way of illustration, FIG. 12B illustrates a top view of the ED-NMOS device 361 of FIG. 12A showing the discretized p drift implant 360 and the square p+ doped region 570. FIG. 12C illustrates a cross-sectional view of FIG. 12B taken along the C-C' section line. As shown in FIG. 12C, when a square p+ doped region 570 is present in a section, there will not be any p drift region 360 to correspond to the square p+ doped region 570 in that section. However, in another cut section such as that shown in FIG. 12D, which illustrates a cross-sectional view of FIG. 12B taken along the D-D' section line, when a p drift implant 360 is present in a section, there will not be any segmented p+ doped region 570 to correspond to the p drift implant 360 in that section. Pursuant to this embodiment of the invention, the p drift implant 360 and the square p+ doped region 570 will continue to alternate positions throughout the ED-NMOS device 361. I.e., the plurality of p+ squares comprising the square p+ doped region 570 are distributed such that they will not be aligned with the p drift implant 360.

As further discussed herein, generally, according to certain embodiments of the invention, a thickness of the thick/thin oxide layer will be greater than a thickness of thin gate oxide layer. According to certain other embodiments of the invention, a thickness of the dielectric layer used for isolation and/or the STI structure will be greater than the thickness of the thick/thin oxide layer.

A device of the invention may conform to any geometrical configuration as may be dictated, for example, where the device is intended to be used. Non-limiting examples of the structure design and geometric configuration include a strip structure, a rectangular structure, a hexagonal structure, an octagonal structure, a circular structure, and a square structure. Any of such exemplary structures may be used in forming an n-channel EDMOS, a p-channel EDMOS, an n-channel LDMOS, or a p-channel LDMOS, for example.

There are many shapes for the conductive layer. Non-limiting examples of the shape of the conductive layer include a tooth structure, for example, a round tooth structure, or a trigonometric structure.

Figure 13A:
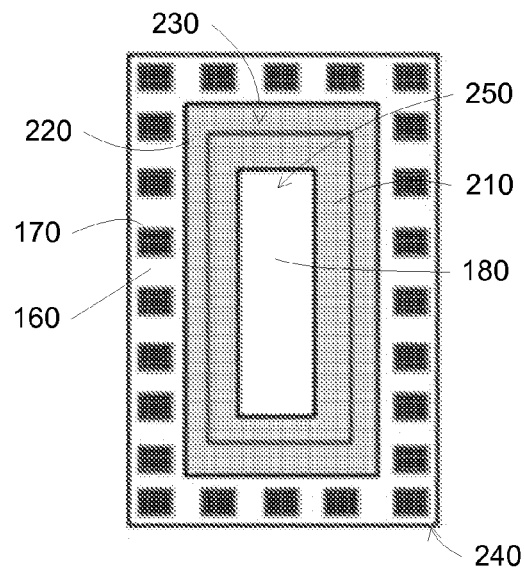
FIG. 13A illustrates a top view of an ED-NMOS device having a rectangular structure according to an embodiment of the invention.

FIG. 13A illustrates a top view of an ED-NMOS device having a rectangular structure according to an embodiment of the invention. The structure of the ED-NMOS of FIG. 13A shows the approximate locations of the source region 240 comprising a source side n+ doped region 160 and a source side p+ doped region 170; a drain region 250 comprising a drain side n+ doped region 180 and a gate region 230 comprising a conductive layer 220 and a thick/thin oxide layer 210. The drain side n+ doped region 250 may be disposed in an NDD implant according to an embodiment of the invention.

Figure 13B:
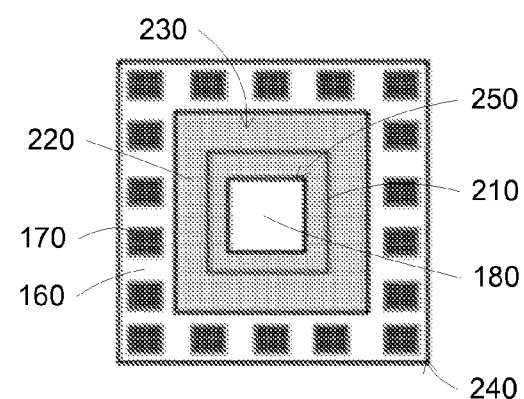
FIG. 13B illustrates a top view of an ED-NMOS device having a square structure according to an embodiment of the invention.

FIG. 13B illustrates a top view of an ED-NMOS device having a square structure according to an embodiment of the invention. The structure of the ED-NMOS of FIG. 13B shows the approximate locations of the source region 240 comprising a source side n+ doped region 160 and a source side p+ doped region 170; a drain region 250 comprising a drain side n+ doped region 180 and a gate region 230 comprising a conductive layer 220 and a thick/thin oxide layer 210. The drain side n+ doped region 250 may be disposed in an NDD implant according to an embodiment of the invention.

Figure 13C:
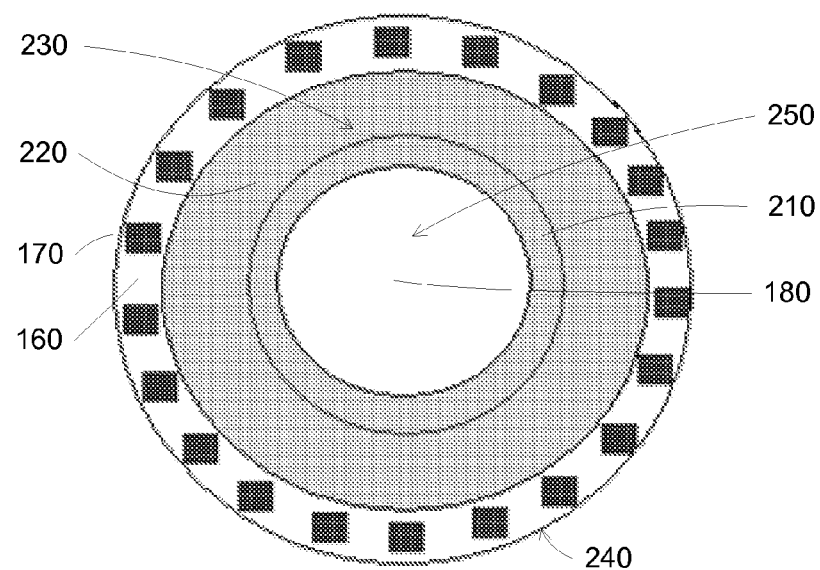
FIG. 13C illustrates a top view of an ED-NMOS device having a circular structure according to an embodiment of the invention.

FIG. 13C illustrates a top view of an ED-NMOS device having a circular structure according to an embodiment of the invention. The structure of the ED-NMOS of FIG. 13C shows the approximate locations of the source region 240 comprising a source side n+ doped region 160 and a source side p+ doped region 170; a drain region 250 comprising a drain side n+ doped region 180 and a gate region 230 comprising a conductive layer 220 and a thick/thin oxide layer 210. The drain side n+ doped region 250 may be disposed in an NDD implant according to an embodiment of the invention.

Figure 14A:
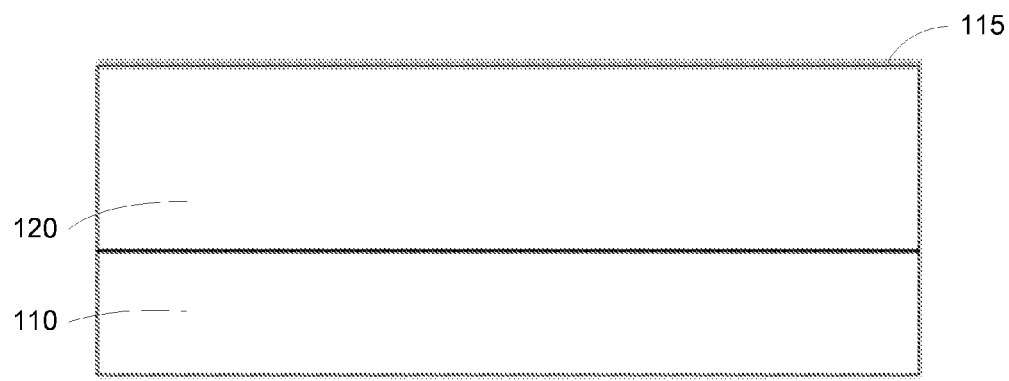
FIGS. 14A-14H illustrate cross-sectional views of an ED-NMOS device after completing various steps of manufacturing an ED-NMOS device according to an embodiment of the invention.
Figure 15:
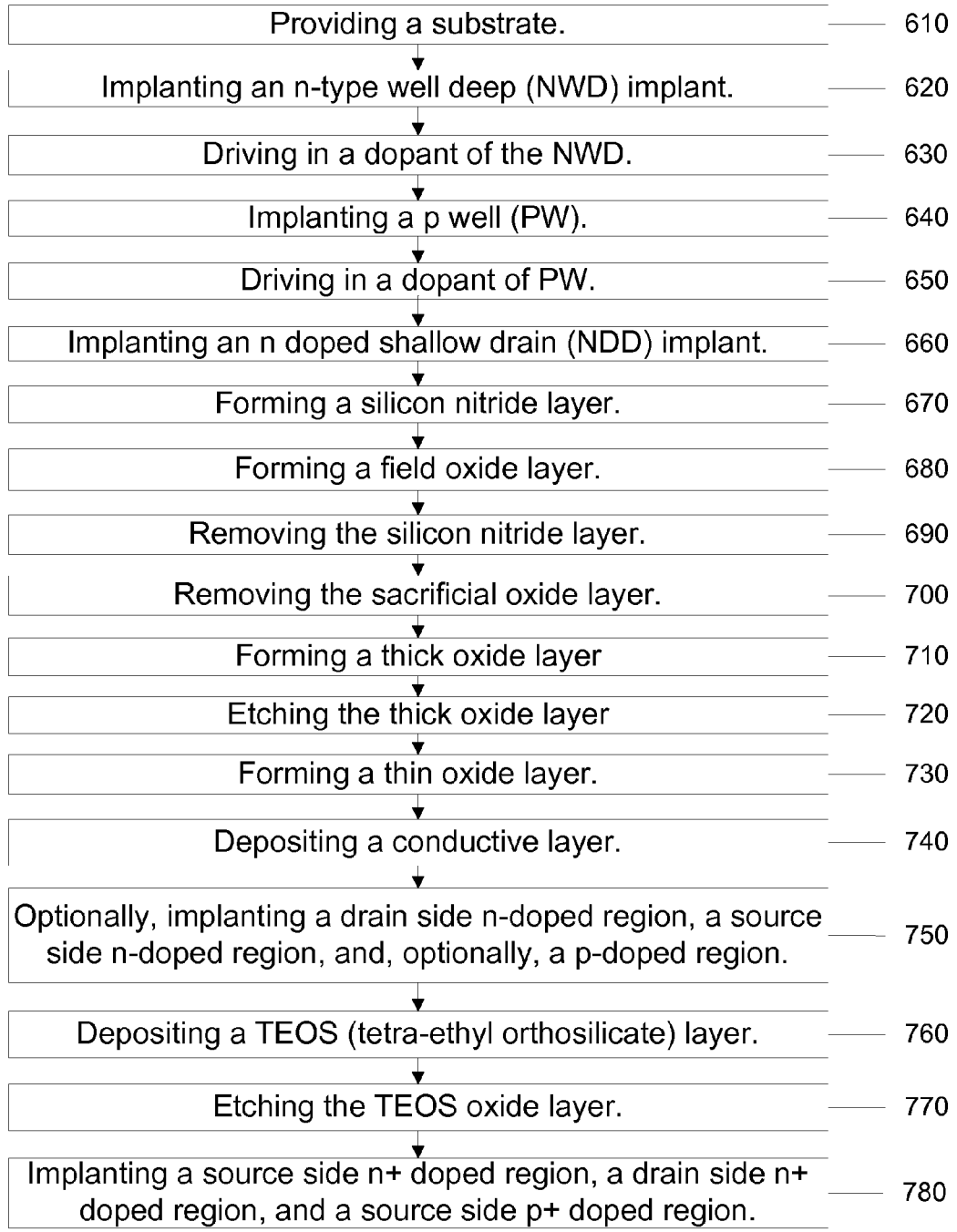
FIG. 15 is a process flow diagram showing the various steps of fabricating an ED-NMOS device according to an embodiment of the invention.

FIG. 15 is a process flow diagram showing the various steps of fabricating an ED-NMOS device according to an embodiment of the invention. The method 601 of fabricating an ED-NMOS device may comprise the steps of providing a substrate 610, implanting an n-type well deep (NWD) 620 implant, and driving in a dopant of the NWD implant 630. FIG. 14A illustrates a cross-sectional view of a device after completing these various steps of the method 601 of fabricating the ED-NMOS device. FIG. 14A shows a substrate 110 and the applied NWD implant 120. FIG. 14A also shows a sacrificial oxide layer 115 applied to the substrate 110.

As described herein, any of the steps of the method for fabricating a semiconductor device of the invention may have a plurality of sub-steps. By way of explanation, a step that recites implanting a well, for example, may comprise sub-steps needed to implant the well using a photolithographic process as a non-limiting example. A step for implanting the well using photolithography may comprise any one of, any combination of, or even all of the sub-steps of cleaning the substrate, depositing a barrier layer, applying a photoresist, soft-baking the photoresist, aligning a mask to the device, exposing a pattern on the device using a light, developing the photoresist, hard-baking the photoresist, implanting the well, and stripping the photoresist.

Figure 14B:
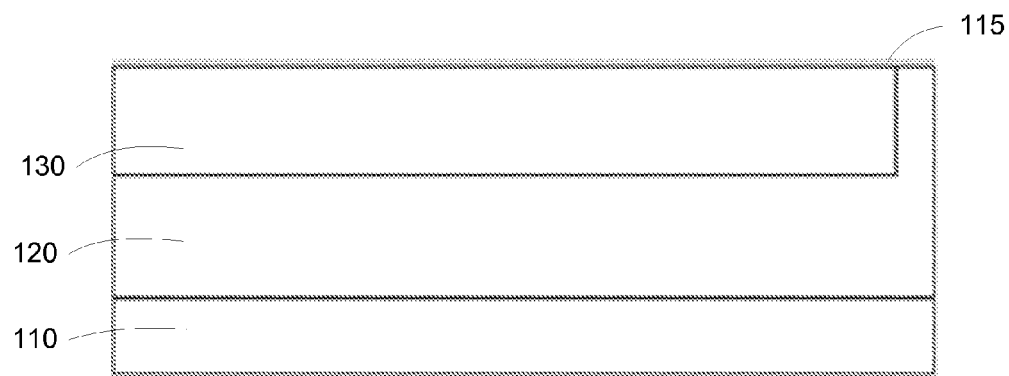

The method 601 of fabricating an ED-NMOS device may additionally comprise implanting a p well (PW) 640 and driving in a dopant of the PW 650. FIG. 14B illustrates a cross-sectional view of an ED-NMOS after completing these various steps of the method 601 of fabricating the ED-NMOS device. FIG. 14B shows the PW 130 implanted using these steps.

Figure 14C:
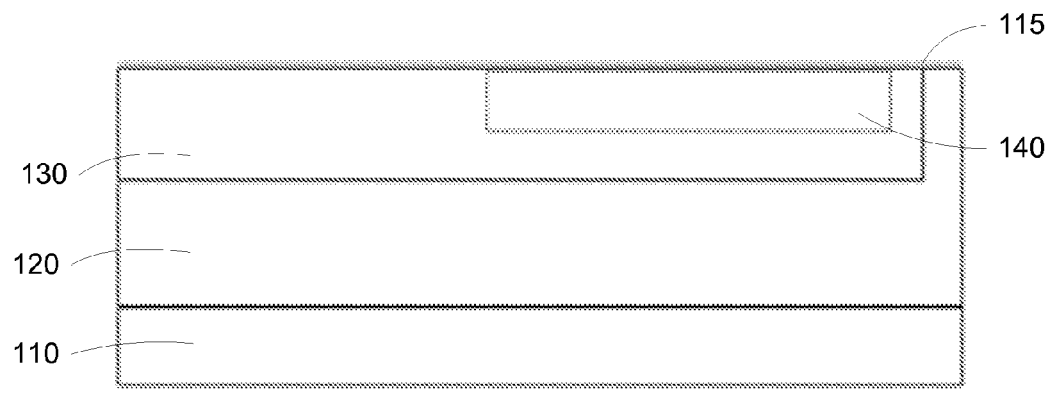

The method 601 of fabricating an ED-NMOS device may additionally comprise implanting an n doped shallow drain (NDD) implant 660. FIG. 14C illustrates a cross-sectional view of a device after completing this step of the method 601 of fabricating the ED-NMOS device. FIG. 14C shows the NDD implant 140 deposited using this step.

Figure 14D:
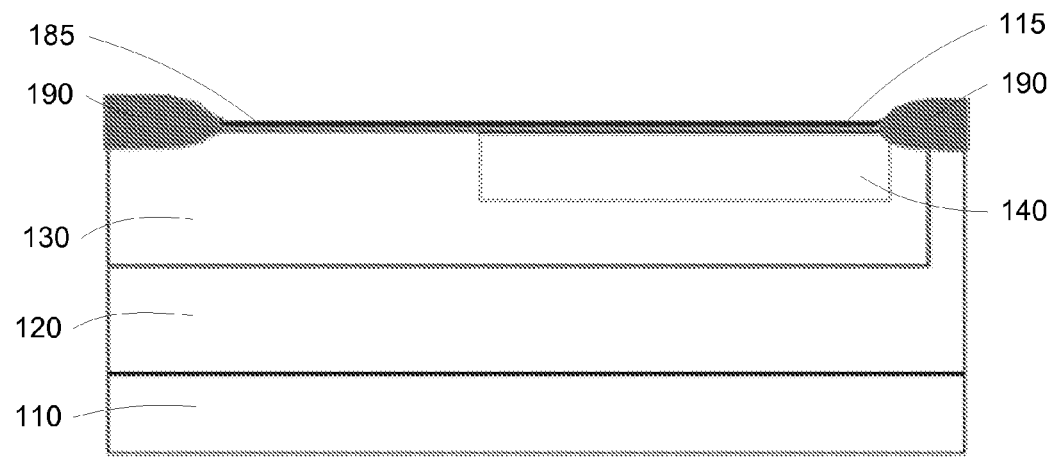

The method 601 of fabricating an ED-NMOS device may additionally comprise the steps of forming a silicon nitride layer 670 and forming a field oxide layer 680. FIG. 14D illustrates a cross-sectional view of a device after completing these various steps of the method 601 of fabricating the ED-NMOS device. FIG. 14D shows the silicon nitride layer 185 formed and the field oxide layer 190 oxidized over the course of these steps.

Figure 14E:
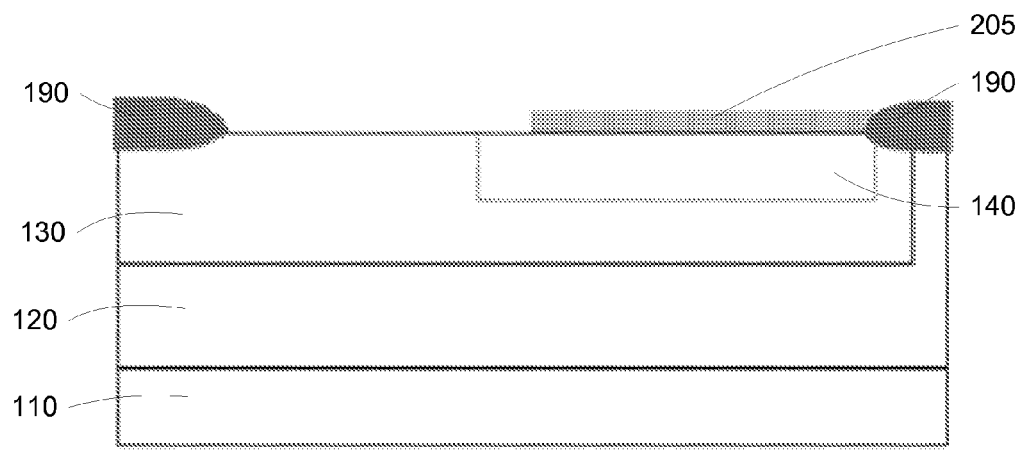

The method 601 of fabricating an ED-NMOS device may additionally comprise the steps of removing the silicon nitride layer 690, removing the sacrificial oxide layer 700, forming a thick oxide layer 710, and etching the thick oxide layer 720. FIG. 14E illustrates a cross-sectional view of a device after completing these various steps of the method 601 of fabricating the ED-NMOS device. FIG. 14E shows that the sacrificial oxide layer 115 and silicon nitride layer 185 have been removed and the thick oxide layer 205 has been formed and etched resulting from these steps.

Figure 14F:
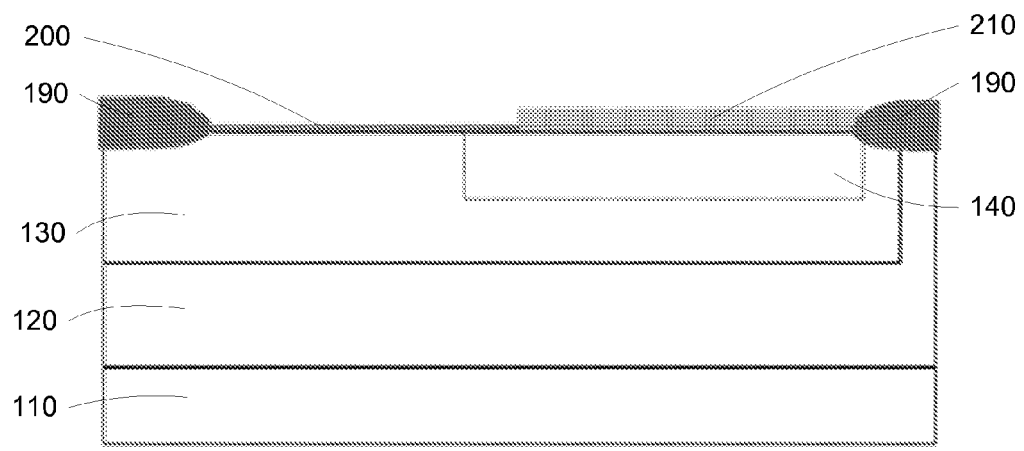

The method 601 of fabricating an ED-NMOS device may additionally comprise forming a thin oxide layer 730. FIG. 14F illustrates a cross-sectional view of a device after completing this step of the method 601 of fabricating the ED-NMOS device. FIG. 14F shows the thin oxide layer 200 deposited using this step. Additionally, the thin oxide layer has been deposited over the thick oxide layer 205 to form the thick/thin oxide layer 210.

Figure 14G:
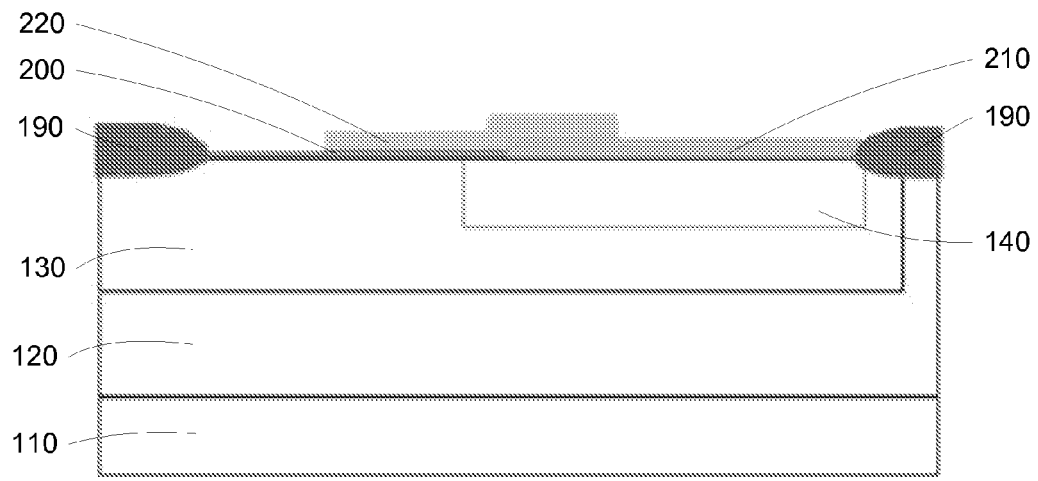

The method 601 of fabricating an ED-NMOS device may additionally comprise depositing a conductive layer 740. FIG. 14G illustrates a cross-sectional view of a device after completing this step of the method 601 of fabricating the ED-NMOS device. FIG. 14G shows the conductive layer 220 deposited using this step.

Figure 14H:
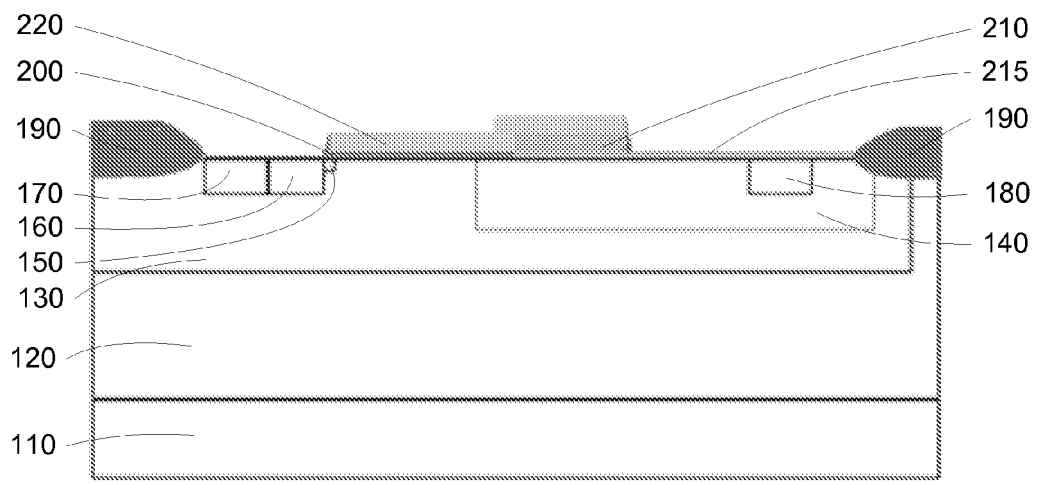

The method 601 of fabricating an ED-NMOS device may additionally comprise optionally, implanting a drain side n-doped region, a source side n-doped region and, optionally, a p-doped region 750; depositing a tetra-ethyl orthosilicate (TEOS) layer 760; etching the TEOS oxide layer 770; and implanting a source side n+ doped region, a drain side n+ doped region, and a source side p+ doped region 780. FIG. 14H illustrates a cross-sectional view of an ED-NMOS after completing these various steps of the method 601 of fabricating the ED-NMOS device. FIG. 14H additionally shows a source side n-doped region 150, which may optionally be implanted in EDMOS devices; an etched oxide layer 215 resulting from the etching of the thick/thin oxide layer 210; and a source side n+ doped region 160, a drain side n+ doped region 180, and a source side p+ doped region 170 formed from the latter implanting step.

Although not shown in the accompanying figures, a method of fabricating an ED-NMOS device may comprise depositing an interlayer dielectric (ILD) layer and depositing a metal layer. Of course, one or more additional metal layers separated by inter-metal dielectric layers may also be applied to the ED-NMOS according to certain embodiments of the invention.

According to another embodiment of the invention, a method of fabricating an ED-NMOS device comprises providing a substrate; implanting an n-type well deep (NWD) implant in the substrate; driving in a dopant of the NWD implant; implanting a p well (PW) into the NWD implant; driving in a dopant of the PW; and implanting an n doped shallow drain (NDD) implant in the p well to substantially define a drift region.

A method of fabricating an ED-NMOS device may additionally comprise forming a plurality of isolation regions in the ED-NMOS device, wherein the plurality of isolation regions be any one of a field oxide layer, a shallow trench isolation structure, and any combination thereof.

A method of fabricating an ED-NMOS device may additionally comprise forming a thick oxide layer across the substrate; etching the thick oxide layer such that it is disposed above at least a portion of the drift region; forming a thin oxide layer disposed across the substrate and the thick oxide layer; and disposing a conductive layer across a portion of the thin oxide layer and a portion of a thick/thin oxide layer.

A method of fabricating an ED-NMOS device may additionally comprise implanting a source side n-doped region in the PW; etching the thick/thin oxide layer; and implanting a source side n+ doped region, a drain side n+ doped region, and a source side p+ doped region.

Methods of the invention may be applied to fabricating an ED-PMOS device, a LD-NMOS device, a LD-PMOS device, or even a LLDMOS device by a person of ordinary skill in the art having the benefit of this disclosure.

An aspect of the invention provides methods of fabricating a semiconductor device of the invention. Any manufacturing process known to those having ordinary skill in the art having the benefit of this disclosure may be used to manufacture the semiconductor devices of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of fabricating a semiconductor device comprising:
    providing a substrate;
    implanting an n-type well deep (NWD) implant in the substrate;
    driving in a dopant of the NWD implant;
    implanting a p well (PW) into the NWD implant;
    driving in a dopant of the PW; and
    implanting an n doped shallow drain (NDD) implant in the p well to substantially define a drift region disposed between a channel region on one side and a drain region on another side, the channel region adjacent to a source region;
    forming an isolation region in the semiconductor device, the isolation region having any one of a field oxide layer, a shallow trench isolation structure, and any combination thereof;
    forming a thick oxide layer across the substrate;
    etching the thick oxide layer such that it is disposed above at least a portion of the drift region;
    forming a thin oxide layer disposed across the substrate and the thick oxide layer, the thin oxide layer and the thick oxide layer forming a thick/thin oxide layer; and
    disposing a conductive layer across a portion of the thin oxide layer and another portion of the thick/thin oxide layer.

2. The method of fabricating the semiconductor device of claim 1 additionally comprising:
    implanting a source side n− doped region in the PW;
    etching the thick/thin oxide layer;
    implanting a source side n+ doped region and a source side p+ doped region to define a contact for the source region; and
    implanting a drain side n+ doped region to define another contact for the drain region.

3. The method of fabricating the semiconductor device of claim 2, wherein the source side p+ doped region is a square p+ doped region having a plurality of p+ squares surrounded by the source side n+ doped region.

4. The method of fabricating the semiconductor device of claim 2 further comprising:
    disposing an n-channel threshold voltage adjust implant in at least a portion of the NDD implant proximate to a surface of the substrate.

5. The method of fabricating the semiconductor device of claim 2 further comprising:
    disposing a p drift implant in the NDD implant.

6. The method of fabricating the semiconductor device of claim 5, wherein the source side p+ doped region is a square p+ doped region having a plurality of p+ squares surrounded by the source side n+ doped region and none of the plurality of p+ squares is aligned with the p drift implant.

7. The method of fabricating the semiconductor device of claim 1, wherein a thickness of the thin oxide layer is less than a thickness of the thick/thin oxide layer.

8. The method of fabricating the semiconductor device of claim 1, wherein the thickness of the thin oxide layer is from about 30 Å to about 180 Å and the thickness of the thick/thin oxide layer is from about 120 Å to about 1100 Å.

9. The method of fabricating the semiconductor device of claim 1 further comprising:
    disposing a high temperature oxide (HTO) layer substantially across the thick/thin oxide layer.

10. The method of fabricating the semiconductor device of claim 1, wherein the semiconductor device is an extended drain n-channel metal oxide semiconductor (ED-NMOS) device.

11. The method of fabricating the semiconductor device of claim 10, wherein a concentration of a dopant in the NDD implant is from about $5 \times 10^{12}$ atoms/cm$^2$ to about $1 \times 10^{14}$ atoms/cm$^2$.

12. The method of fabricating the semiconductor device of claim 11, wherein a slope of a channel current ($I_{ds}$) versus a channel voltage ($V_{ds}$) as the ED-NMOS device transitions from a linear response to saturation is at least about $6 \times 10^{-5}$ A/μm-V.

13. The method of fabricating the semiconductor device of claim 1 further comprising:
    disposing a plurality of isolation structures in the semiconductor device, wherein a first isolation structure of the plurality of isolation structures is adjacent to the source region at a side opposite the channel region, and a second isolation structure of the plurality of isolation structures adjacent to the drain region at another side opposite the drift region.

14. The method of fabricating the semiconductor device of claim 13 wherein a third isolation structure of the plurality of isolation structures is defined by a gate region and the drain region and is substantially aligned with the drift region.

15. The method of fabricating the semiconductor device of claim 13, wherein the plurality of isolation structures may be any one of a field oxide layer, a shallow trench isolation structure, and any combination thereof.

16. The method of fabricating the semiconductor device of claim 1, wherein the thickness of the thin oxide layer is from about 30 Å to about 180 Å.

17. The method of fabricating the semiconductor device of claim 1, wherein the thickness of the thick/thin oxide layer is from about 120 Å to about 1100 Å.

* * * * *